United States Patent
Wile et al.

(10) Patent No.: US 7,834,293 B2
(45) Date of Patent: Nov. 16, 2010

(54) METHOD AND APPARATUS FOR LASER PROCESSING

(75) Inventors: Donald E. Wile, Beaverton, OR (US); Brian C. Johansen, Hillsboro, OR (US)

(73) Assignee: Electro Scientific Industries, Inc., Portland, OR (US)

(*) Notice: Subject to any disclaimer, the term of this patent is extended or adjusted under 35 U.S.C. 154(b) by 169 days.

(21) Appl. No.: 11/417,269

(22) Filed: May 2, 2006

(65) Prior Publication Data
US 2007/0257012 A1 Nov. 8, 2007

(51) Int. Cl.
B23K 26/38 (2006.01)
B23K 26/08 (2006.01)
B23K 26/03 (2006.01)

(52) U.S. Cl. ............ 219/121.69; 219/121.82
(58) Field of Classification Search ............ 219/121.68, 219/121.69, 121.82, 121.71; 382/151
See application file for complete search history.

(56) References Cited

U.S. PATENT DOCUMENTS

| | | | | |
|---|---|---|---|---|
| 4,708,545 A * | 11/1987 | Fujii et al. | | 409/131 |
| 4,873,417 A * | 10/1989 | Moriyasu et al. | | 219/121.67 |
| 5,111,406 A * | 5/1992 | Zachman et al. | | 700/160 |
| 5,690,846 A * | 11/1997 | Okada et al. | | 219/121.71 |
| 5,948,291 A * | 9/1999 | Neylan et al. | | 219/121.77 |
| 6,201,214 B1 * | 3/2001 | Duffin | | 219/121.71 |
| 6,340,806 B1 * | 1/2002 | Smart et al. | | 219/121.62 |
| 6,580,054 B1 * | 6/2003 | Liu et al. | | 219/121.68 |
| 6,610,961 B1 * | 8/2003 | Cheng | | 219/121.71 |
| 7,132,622 B2 * | 11/2006 | Ito et al. | | 219/121.82 |
| 7,329,830 B2 * | 2/2008 | Baudron et al. | | 219/121.68 |
| 2003/0178398 A1 * | 9/2003 | Nagatoshi et al. | | 219/121.7 |
| 2004/0105092 A1 * | 6/2004 | Iwata | | 356/237.2 |
| 2005/0205778 A1 * | 9/2005 | Kitai et al. | | 250/309 |
| 2006/0138097 A1 * | 6/2006 | Hiramatsu | | 219/121.7 |

FOREIGN PATENT DOCUMENTS

| | | | |
|---|---|---|---|
| EP | 927597 A1 * | 7/1999 | |
| JP | 61-172003 A * | 8/1986 | |
| JP | 6-20899 A | 1/1994 | |
| JP | 7-171796 A * | 7/1995 | |
| JP | 5-57874 A * | 3/1998 | |
| JP | 10-58173 A * | 3/1998 | |
| JP | 2002-283074 | 10/2002 | |
| JP | 2002-283074 A | 10/2002 | |
| JP | 2003-112278 | 4/2003 | |
| JP | 2003-340586 A * | 12/2003 | |
| WO | WO-96/11769 A1 * | 4/1996 | |

OTHER PUBLICATIONS

Written Opinion of the International Searching Authority for PCT/US2007/067945, dated Oct. 1, 2007, 4 pages.

* cited by examiner

*Primary Examiner*—Geoffrey S Evans
(74) *Attorney, Agent, or Firm*—Patrick F Leonard

(57) ABSTRACT

A method and an apparatus for processing workpieces with a laser beam include first and second stages for holding the workpieces and first and second laser beam paths. The first workpiece is loaded upon the first stage, aligned with the first laser beam path, and processing begun. While the first workpiece is aligned in relation to the first laser beam path, the second workpiece is prepared in relation to the second laser beam path. Processing of the second workpiece is begun as soon as the laser beam is available for processing.

14 Claims, 5 Drawing Sheets

METHOD AND APPARATUS FOR LASER PROCESSING

TECHNICAL FIELD

Generally, the present invention relates to laser processing a workpiece. Particularly it relates to laser processing apparatus which provides at least two substantially independent workpiece holders. More particularly it relates to laser processing apparatus able to manipulate at least two substantially independent workpiece holders which allow two or more workpieces to go through different processing steps simultaneously. Processing steps may include loading, aligning, micromachining, inspection or unloading a workpiece. The present invention allows for the micromachining of one or more workpieces while one or more additional workpieces are going through other processing steps without substantially altering or delaying overall processing.

BACKGROUND OF THE INVENTION

Laser processing is employed on a variety of electronic devices to achieve a variety of effects. Typically electronic devices appear at various stages of their manufacture as substantially planar arrays of identical components referred to as workpieces. Examples of workpieces include semiconductor wafers, printed or etched wiring or circuit boards, or arrays of passive or active components built upon ceramic or silicon substrates, among others. In general, workpieces are conveyed to and from the particular apparatus performing the laser processing either individually or in batches, often being carried in cassettes or magazines that can be automatically unloaded and loaded. The term laser processing includes loading the workpiece onto the apparatus, aligning the workpiece to the apparatus, performing the laser processing, and then unloading the workpiece from the apparatus. Laser processing can be conducted on numerous different workpieces using various lasers effecting a variety of processes. Examples of laser processing include laser processing of a single or multilayer workpiece to effect hole and/or via formation and laser processing of a semiconductor wafer to effect wafer dicing or singulation. The laser processing methods described herein could also be applied to many other types of laser material interaction processes, including but not limited to removal of semiconductor links (fuses), thermal annealing, trimming passive components, or scribing or singulating wafers, including silicon, or substrates, including ceramic.

Several factors determine the desirability of a laser processing apparatus. These include accuracy, quality, usability, flexibility and throughput. These also include such apparatuses having multifunctional capability. Adding other functions to the apparatus allows the user of such apparatus to either gain throughput by avoiding transferring the workpiece between differing apparatuses, reducing cost through the elimination of differing apparatuses, or both. Throughput is a very important consideration because of its direct impact on the cost of processing on a per workpiece basis. System throughput is a function of several factors, including material removal rate, workpiece and laser beam positioning speed and other system overhead. System overhead is the time for all operations of a laser processing apparatus not directly involved with material removal or modification. It may include loading and unloading workpieces, aligning workpieces, inspecting workpieces, waiting for mechanical components to settle following motion, and waiting for lasers and other electronic components to settle electrically upon powering up or changing parameters.

Material removal rates for via formation in multilayer substrates by laser processing is partially determined by the complexity of the multilayer substrate being processed which is a function of factors generally beyond the control of the laser system designer. FIG. 1 shows an exemplary multilayer workpiece 10 of an arbitrary type that includes layers 12, 14, 16, and 18. Typically, layers 12 and 14 are metal layers that each include aluminum, copper, gold, molybdenum, nickel, palladium, platinum, silver, titanium, tungsten, a metal nitride, or a combination thereof. Metal layers 12 and 14 may have thicknesses that are between about 9 µm and about 36 µm, but they may be thinner than 9 µm or as thick as 72 µm or more.

Each layer 16 typically includes a standard organic dielectric material such as benzocyclobutane (BCB), bismaleimide triazine (BT), cardboard, a cyanate ester, an epoxy, a phenolic, a polyimide, polytetrafluoroethylene (PTFE), a polymer alloy, or a combination thereof. Each organic dielectric layer 16 is typically thicker than metal layers 12 and 14. The thickness of organic dielectric layer 16 may be between about 30 µm and about 1600 µm.

Organic dielectric layer 16 may include a thin reinforcement component layer 18. Reinforcement component layer 18 may include fiber matte or dispersed particles of, for example, aramid fibers, ceramics, or glass that have been woven or dispersed into organic dielectric layer 16. Reinforcement component layer 18 is typically much thinner than organic dielectric layer 16 and may have a thickness that is between about 1 µm and about 10 µm. Reinforcement material may also be introduced as a powder into organic dielectric layer 16. Reinforcement component layer 18 including this powdery reinforcement material may be noncontiguous and nonuniform.

Layers 12, 14, 16, and 18 may be internally noncontiguous, non-uniform, and non-level. Stacks having several layers of metal, organic dielectric, and reinforcement component materials may have a total thickness that is greater than 2 mm. Although the arbitrary workpiece 10 shown as an example in FIG. 1 has five layers, the present invention can be practiced on a workpiece having any desired number of layers, including a single layer substrate.

Material removal rate for a laser processing apparatus is also limited by the per-pulse laser energy available and pulse repetition rate. Increased processing throughput can be accomplished by increasing the pulse repetition rate at pulse energy sufficient to cause material removal via either ablation, thermal vaporization, or a combination of both. For most lasers used in processing applications, however, pulse energy is approximately inversely proportional to pulse repetition rate. As a result there will be a maximum rate of material removal governed by the minimum pulse energy needed to cause material removal and the maximum pulse repetition rate at which that energy is available. Selection of lasers, in terms of pulse energy available and pulse rate, is affected by technological advancement, cost, and other performance parameters which may limit the laser processing system designer's choice.

Another factor affecting system throughput of a laser processing apparatus is laser beam positioning speed. Laser processing typically involves directing a laser beam at a particular point on a workpiece and operating the laser for a specific duration or number of laser pulses. The laser beam is directed at the specific point on the workpiece by moving the workpiece, the laser beam or a combination of both. The laser beam can be directed to a specific location on the workpiece where laser processing is accomplished and subsequently directed to a next location where further processing is accomplished. Alternatively, the laser beam may be directed to move substantially continuously with respect to the workpiece, the laser beam then describing a path on the workpiece along which processing is accomplished by pulsing or otherwise operating the laser during the relative motion between the laser beam and the workpiece. Laser processing can also be accomplished by a combination of these methods. What is common to both of these methods is that the rate of material removal is influenced by the rate at which the laser beam's position with respect to the workpiece can be changed. Several factors influence the choice of motion control components that determine the speed of laser beam positioning including cost, accuracy, power consumption and size.

It is also necessary for laser power to be stable during processing to insure consistent, repeatable results. To accomplish this, apparatuses typically use laser power or energy detectors during processing to monitor laser power and verify that lasers are operating within necessary parameters. Both the lasers and the power/energy detectors contribute to system overhead because they need time to stabilize after being turned on, thereby decreasing system throughput each time they are turned on. Lasers are expensive components with useful lifetimes that are relatively limited and proportional to the length of time they are turned on. Thus, lasers are typically turned off if they are to be idle for prolonged periods during system operations such as loading and unloading workpieces.

System throughput can also be influenced by system overhead. This includes time required to load, align and unload workpieces. FIG. 2 shows a timing diagram for a prior art apparatus that loads, processes and unloads workpieces sequentially. Examination of the timing chart shown in FIG. 2 reveals that a substantial amount of the total time required to process a workpiece, shown in the diagram as time 0 to $t_2$, on a laser processing apparatus is spent on the overhead activities of loading, aligning, and waiting for the laser to settle 20 (time 0 to $t_1$) in relation to the time spent processing 22 (time $t_2$-$t_1$).

Some laser processing systems apply more than one laser beam to process more than one location simultaneously. An example of a prior art apparatus employing two lasers is the apparatus described in US Patent Application Publication 2005/00985496, "Laser Beam Machining Apparatus." The apparatus disclosed therein has two workpieces mounted on the apparatus and processed simultaneously with two laser beams. FIG. 3 shows a timing diagram of this prior art approach to increasing throughput by processing two workpieces simultaneously. The two timelines labeled WP1 and WP2 denote processing being applied to two workpieces at the same time. Both workpieces are loaded during time periods 30 and 32. Both workpieces are processed during time periods 34 and 36. During time periods 38 and 40 both workpieces are unloaded and new workpieces are loaded into the apparatus. Processing on the two new workpieces occurs during time periods 42 and 44. Although this apparatus can yield up to twice the throughput of a single station prior art apparatus, examination of the timing diagram in FIG. 3 still shows substantial system overhead devoted to loading and unloading workpieces. During this load and unload time the lasers are not processing workpieces and are typically turned off. This approach suffers from the increased cost and complexity of adding an additional laser and the optical and mechanical components required to direct the laser beam to the workpiece, but still does not avoid the processing time delays associated with turning on and stabilizing the lasers.

There is a continuing need for an apparatus for performing laser processing of electronic components, capable of increased throughput when using either a single or multiple laser beams to process workpieces by improving the utilization of the laser and optical components.

SUMMARY OF THE INVENTION

An object of the present invention is, therefore, to provide a method and apparatus for laser processing system with improved throughput of apparatuses employing single or multiple laser beams by improving utilization of laser and optical components. A further object of this invention is to provide a method and a laser processing apparatus which provides multiple functions in a single apparatus without degrading throughput. To achieve the foregoing and other objects in accordance with the purposes of the present invention, as embodied and broadly described herein, a method and apparatus is disclosed herein. The invention is a method and apparatus for processing workpieces with a laser beam, including first and second stages for holding the workpieces and a laser beam path. The first workpiece is loaded upon the first stage, aligned with the laser beam path, and processing begun. While the first workpiece is aligned in relation to the laser beam path the second workpiece is prepared in relation to the laser beam path. Processing of the second workpiece is begun as soon as the laser beam is available for processing.

DETAILED DESCRIPTION OF PREFERRED EMBODIMENTS

Figure 5:
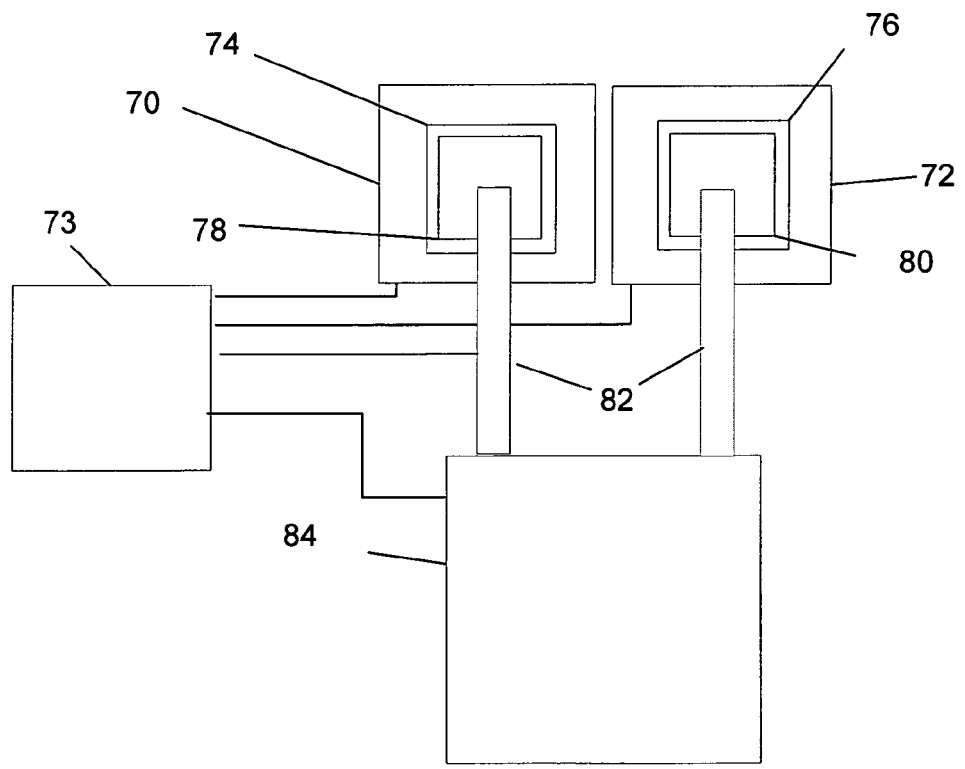
FIG. 5 is a plan view of a preferred embodiment of the present invention.

FIG. 5 is a simplified partial schematic diagram of a plan view of a preferred embodiment of the present invention comprising two X,Y tables 70, 72 holding two stages 74, 76 each of which can hold workpieces 78, 80, respectively. The X,Y tables 70, 72 are independently controlled by a controller 73, which may be a computer and which controls the operation of the various parts which comprise a preferred apparatus. The workpieces 78, 80 are loaded and unloaded from stages 74, 76 by load arm 82, which can move workpieces from either station to and from autoloader 84. The solid lines show load arm 82 positioned to load or unload workpiece 78 to or from stage 74 and the dotted lines show load arm 82 positioned to load or unload workpiece 80 to or from stage 76. Autoloader 84 is a device that holds multiple workpieces and, under control of controller 73 provides unprocessed workpieces to load arm 82 for transport to stages 74, 76 or accepts processed workpieces from load arm 82 for storage in autoloader 84. Gantry 86 and attendant parts are not shown in this view for clarity.

Figure 6:
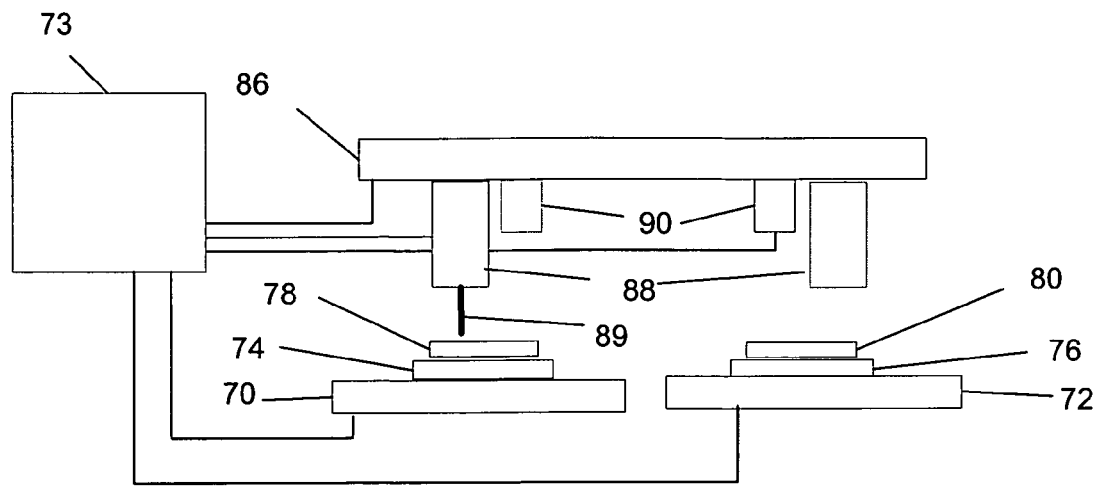
FIG. 6 is an elevation of a preferred embodiment of the present invention.

FIG. 6 is a simplified partial schematic diagram of a front view of this preferred embodiment comprising two X, Y tables 70, 72, holding stages 74, 76, in turn holding a workpieces 78, 80, respectively. Gantry, 86 holds laser beam optical assembly 88 and video assembly 90. Gantry 86 is operative to direct laser beam optical assembly 88 to micromachine either workpiece 78 on stage 74 (solid lines) or workpiece 80 on stage 76 (dotted lines). Similarly, the gantry is operative to direct a video assembly to align, or optionally inspect, workpiece 80 on stage 76 (solid lines) or workpiece 78 on stage 74 (dotted lines). Load arm 82 and autoloader 84 are not shown in this view for clarity.

In this preferred embodiment of the instant invention, the method and apparatus can process both single and multilayer workpieces. Single layer workpieces include thin copper sheets, polyimide sheets for use in electrical applications, and other metal pieces, such as aluminum, steel, and thermoplastics, for general industry and medical applications. Multilayer workpieces include a multi-chip modules (MCM), circuit boards, or semiconductor wafers.

Laser processing typically consists of directing a laser beam at particular locations on a workpiece to effect a change in the workpiece, such as material removal or changing a measurable parameter of the workpiece, for example electrical resistance. Laser processing, furthermore, is typically only one step in a potentially multi-step manufacturing process wherein materials that comprise a workpiece are added, removed or modified. The particular locations to be processed on a workpiece are defined relative to the workpiece or more particularly relative to a pattern on the workpiece representative of previous or subsequent manufacturing steps. Because of normal tolerances associated with the apparatus and the manufacturing process, once a workpiece is loaded onto the apparatus, the actual location of the workpiece or a pattern on the workpiece may differ from an expected location by an amount that is greater than desired. Alignment refers to the step of determining the location the workpiece or pattern on the workpiece with respect to the apparatus.

For laser processing applications to perform their processing with the necessary accuracy, the workpiece must be prepared. Preparation is comprised of loading, determining the rotation of, and aligning the workpiece to the laser beam. One way to align the laser beam with the workpiece is to use a vision-based measurement subsystem. In this case a video camera is focused on the workpiece either through the laser beam optics or through another set of optics. The workpiece may be illuminated by the working laser beam, sometimes at reduced power, or by other lighting. The video camera is typically connected to a computer which acquires the video data in digital form and processes it to determine the precise location of features in the field of view. During alignment, this vision-based measurement subsystem is utilized to determine the actual locations of one or more alignment targets that already exist on the workpiece. Typically, alignment targets or fiducials are patterns that were created on the workpiece through the course of a previous manufacturing process, and the locations to be processed by the laser are defined with respect to these targets. As such, knowledge of how the alignment targets were transformed from their ideal locations to those that were measured during alignment can be used to determine a transformation function or mapping which is then applied to the ideal laser processing locations so that the laser beam is directed precisely at the desired point on the workpiece during processing. The process through which actual alignment target locations are identified is typically referred to as the "alignment routine." The resulting transformation or mapping from the ideal locations is typically referred to as the "alignment algorithm."

In the simplest case, the workpiece can be assumed to be a rigid, planar object located in a known plane with respect to the apparatus. In this case the mathematical relationship between the expected or nominal location of the workpiece and the actual or measured location can be expressed as an affine transform. If the relationship is affine, the relationship between the Cartesian coordinates of a measured point and the coordinates of its nominal location can be expressed by the linear equations $$x'=Ax+By+C$$

$$y'=Dx+Ey+F$$

where x', y' are the coordinates of the nominal point, x, y are the coordinates of the measured point and A, B, C, D, E, and F are constants. This transformation can handle situations where the differences between the workpiece actual location and the nominal or expected location can be expressed by translations, rotations and scale changes in a given plane. If the workpiece is assumed to be a rigid planar object that is free to assume an arbitrary pose with respect to the apparatus, the transformation that relates the measured position of the workpiece to the nominal position is a perspective transformation which follows the general form $$x'=(Ax+By+C)/(Gx+Hy+I)$$

$$y'=(Dx+Ey+F)/(Gx+Hy+I)$$

where x', y', x, y, A, B, C, D, E and F are as above and G, H and I are also constants. Other, more complex, solutions exist where the workpiece is no longer required to be a rigid, planar object. These solutions can typically use higher order equations to describe the surface or sometimes divide the surface into smaller regions each of which can be approximated by a simpler transformation. What these methods have in common are that the actual locations of points on the workpiece are identified and located with relation to the apparatus, with the eventual goal of accurately directing a laser beam to a desired location on the workpiece. This goal can be accomplished by physically moving the workpiece with respect to the laser beam or calibrating the control software which moves the laser beam with respect to the workpiece with the information regarding the alignment of the workpiece to the apparatus or a combination of both.

The goal of the alignment process is to align the workpiece so that one or more laser pulses will impinge upon a workpiece at a desired location. However, since laser pulses exist only while the laser is actually emitting energy, during alignment the workpiece may be aligned relative to the laser beam or laser beam path, which is the path along which the laser pulses would travel if it were to emit energy at that time. Furthermore, laser beams are sometimes shaped, apertured and focused to have a particular three-dimensional size and shape. In this case alignment comprises locating particular points on the workpiece with respect to a particular location along the laser beam path that corresponds to desired characteristics of the laser beam.

Another aspect of alignment is that although the goal is to align the workpiece with a point on the laser beam path, that point may not be known at alignment time. Furthermore, the workpiece, or the laser beam, or both may be moved by the apparatus following alignment but prior to processing. The solution is that the alignment is performed with respect to a datum or known point on the apparatus. In this way as long as the location of the laser beam and the workpiece are both known in relation to the datum and this information is retained while moving either, the location of a point on or beneath the surface of the workpiece with respect to the laser beam can be calculated. This datum may be explicit, comprising a known point on the apparatus, or may be implicit, for instance aligning the workpiece to a laser beam path or a camera/lens assembly which has a known relationship to the laser beam path(s). An explicit datum may be located on a moveable part of the apparatus, such as a moveable workpiece station or chuck. The case where a component, such as the laser beam, is moved from one known location to another known location is referred to as indexing. In this case the moveable part typically indexes between locations at which its alignment with the rest of the apparatus is repeatably known. Alignment always depends upon the existence of a datum point or coordinate system, whether implicit or explicit. The actual process of alignment can be accomplished by physically changing either the location of the workpiece or the laser beam path, or it can be accomplished by using the alignment information to calculate the appropriate location to direct the laser beam to in order to process the desired location on the workpiece. This calculation may be expressed as a coordinate transformation. It is also sometimes desired to perform additional alignment steps either immediately before or during processing to refine the initial alignment or compensate for changes in alignment that may occur during the process. This final alignment step is sometimes performed, for example, following indexing, due to errors in alignment introduced into the system by normal manufacturing tolerances. This is an alignment check that confirms the accuracy of the previous pre-alignment step and possibly refines the previous estimate with all of the components in their final position to begin processing.

The instant invention increases system throughput by providing at least a second station where a second workpiece to be processed can be loaded and pre-aligned at a second station substantially independently while a previously loaded and aligned first workpiece is being processed at the first station. When the first workpiece is finished being processed, the apparatus changes the relative position of the laser beam with respect to the second station so as to enable the laser beam to micromachine the second workpiece. In a preferred embodiment, this change in relative position is accomplished by the station. However, it is contemplated that some portion of the laser beam optics or both the station and the optics can change to the accomplish the change. For any of the contemplated variations, the change can be rapid enough to occupy a small fraction of the time required to either load and align or micromachine a substrate. This yields at least two benefits: The first is the obvious time reduction and consequent increase in system throughput due to rapidly directing the laser beam path at the workpiece and beginning to micromachine without having to wait for a lengthy load and alignment. The second is that since the direction of the laser beam path to the workpiece is rapid, the laser does not have to be shut off and turned back on, thereby eliminating or significantly reducing the need for laser settling time.

For this preferred embodiment, the ability to pre-align a workpiece on a station, in relation to a datum or set of datums, while the laser beam or beams are processing a previously loaded and aligned workpiece makes this increase in throughput possible. During pre-alignment, a workpiece is aligned with respect to a reference or a set of references within the apparatus, or datum or datums. The laser beam path or paths, while not directed at the workpiece being pre-aligned, are also implicitly aligned with respect to the datum or datums. Prior to processing when the workpiece or the laser beam path or paths or both are moved to direct the laser beam path to the workpiece, the move or moves are made so as to maintain the relative alignment of both the laser beam path or paths and the workpiece with the apparatus reference at least at the end of the move. At the completion of the move or moves, since the laser beam path or paths and the workpiece have maintained their alignment with a common reference point or previously-calibrated coordinate system, they are substantially aligned with respect to each other.

For this preferred embodiment, an additional step of checking and possibly refining the final alignment is contemplated and may be performed at this point prior to beginning processing in order to compensate for small misalignments caused by normal manufacturing tolerances or thermal expansion in the components used to move the laser beam path or paths or the workpiece. This final alignment occupies only a small fraction of the time required to fully align a workpiece and thus does not represent a substantial decrease in system throughput.

As the apparatus of this preferred embodiment begins processing the second workpiece, the first workpiece is optionally inspected and then unloaded, and a new workpiece is loaded in its place. This can be extended to more than two substantially independent load and unload stations operating as described above such that one or more workpieces could be processed on one or more machining stations. In this way a plurality of machining stations employing a plurality of laser beams could be used a higher percentage of the total time available for processing, thereby further increasing system throughput.

Figure 4:
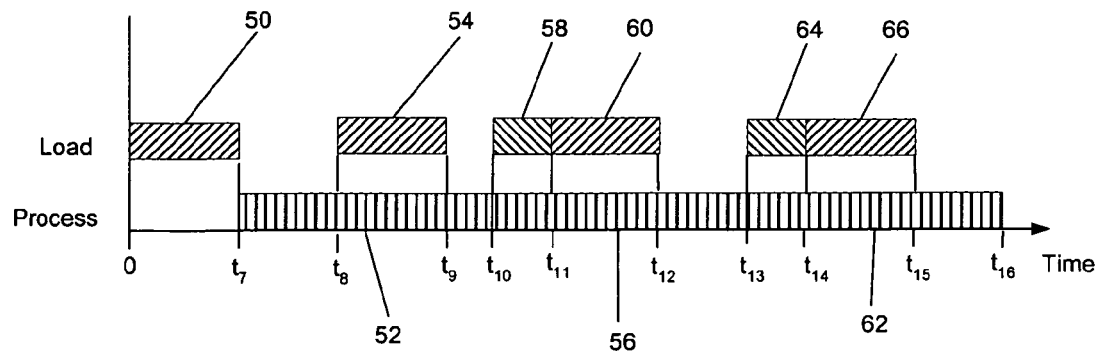
FIG. 4 is a timing diagram showing load and processing times for the present invention.

A timing diagram illustrating the operation of this preferred embodiment is shown in FIG. 4, where the upper row, marked "load" shows the time spent loading and aligning the workpieces 78, 80 and optionally inspecting the workpieces while the row marked "process" shows the time spent processing the workpieces. Starting at time 0, first workpiece 78 is loaded and aligned 50 onto a first station 74. At time $t_7$ first workpiece 78 is ready to be processed and the first station 74 is brought into the correct relationship with the laser beam path 89 and processing is begun. At time $t_8$ second workpiece 80 is loaded onto second station 76 and alignment 54 is begun. At time $t_9$ the loading and alignment of second workpiece 80 on second station 76 is complete and it is ready for processing. At time $t_{10}$ the system brings second station 76 into the proper relationship with laser beam path 89 and processing of second workpiece 80 begins 56. Also at time $t_{10}$ first workpiece 78 on first station 74 is available for an optional inspection step 58. At this time workpiece 78 is inspected by an automated process (not shown) to determine the quality and placement accuracy of the laser process. The information so generated can be transmitted to a controller (also not shown) to compile data for a statistical quality control procedure, to guide additional processing of the workpiece if recoverable errors are detected, or to compensate for possible thermal deformation in the drilling apparatus. At time $t_{11}$ inspection step 58 is complete and first workpiece 78 is unloaded and an additional workpiece is loaded and aligned 60 on to first station 74. At time $t_{12}$ the additional workpiece is finished being aligned 60 and is ready for processing. At time $t_{13}$ the system moves the laser beam into the proper relationship with first station 74 holding the additional workpiece and processing 62 begins. Also at time $t_{13}$ second workpiece 80 on second station 76 is available for optional inspection 64. At time $t_{14}$ optional inspection 64 is complete, second workpiece 80 is unloaded and a new, unmachined workpiece is loaded, pre-aligned and thereby made ready for processing 66 By loading and pre-aligning the next workpiece while the current workpiece is being processed, this process can be extended for the duration of the processing process for an indeterminate number of workpieces, reducing the overhead associated with loading, unloading and aligning each workpiece and thereby increasing system throughput.

Figure 1:
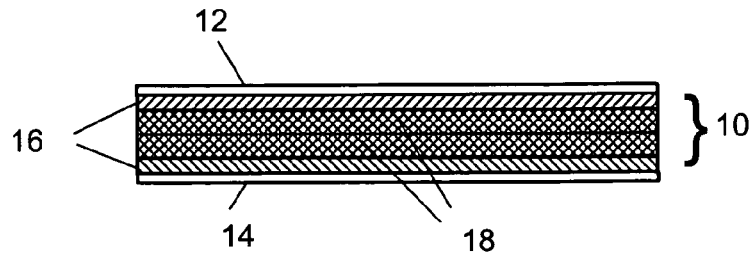
FIG. 1 is an end view of a multilayer workpiece.
Figure 2:
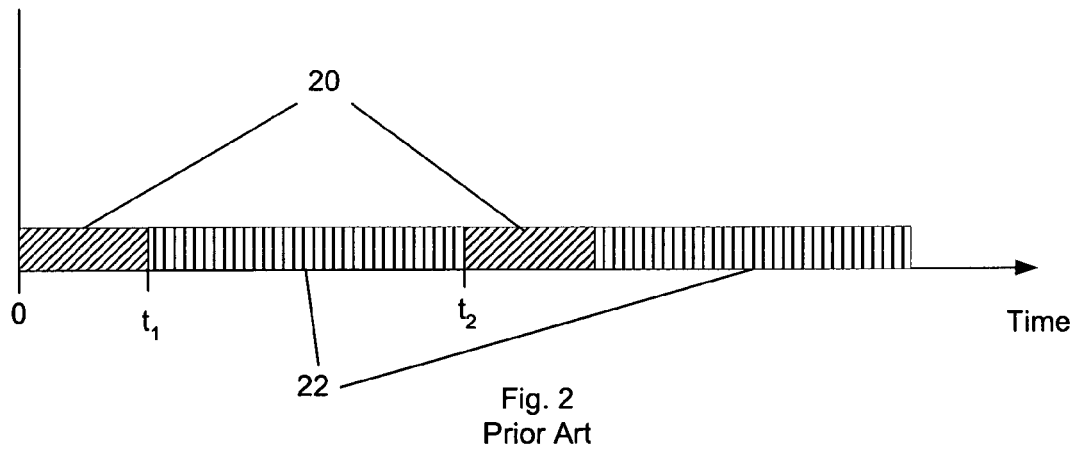
FIG. 2 is a timing diagram showing load and processing times for a prior art single laser processing system.
Figure 3:
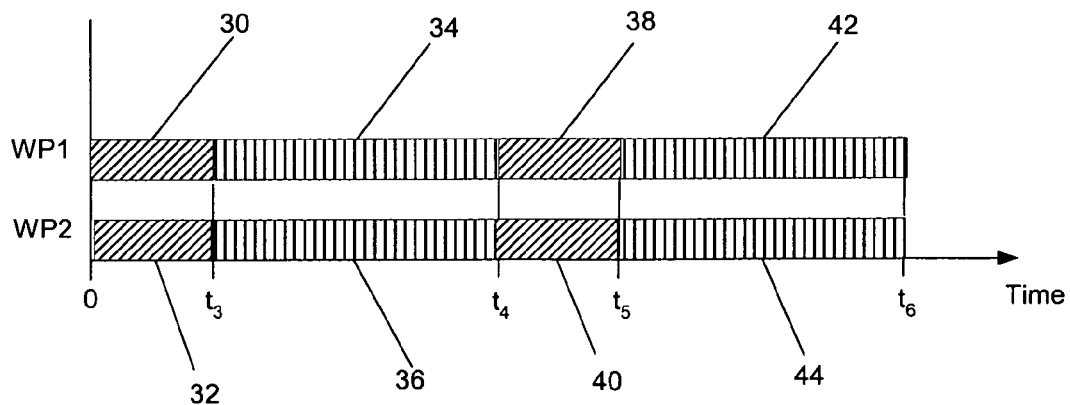
FIG. 3 is a timing diagram showing load and processing times for a prior art dual laser processing system.

Another advantage of the instant invention and embodied in this preferred embodiment is the elimination or reduction of laser settling time from the processing process. In the time line associated with the prior art illustrated in FIGS. 2 and 3, during the time periods associated with loading and aligning workpieces (20, 30, 32, 38, 40), the laser beam is not performing processing and is typically turned off to prolong the life of the laser oscillator, laser optics and other parts of the laser beam subsystem. Prior to beginning processing, the laser is turned back on and allowed to stabilize. The time period required for the laser to stabilize is referred to a settling time and can be a substantial fraction of the load and alignment time. In the apparatus and method disclosed herein, the laser does not have to be turned off between workpieces since the time between processing workpieces is limited to the amount of time the system takes to move the laser beam into the proper relationship with the workpiece and perform the final alignment of the laser beam to the workpiece. This time is typically a small fraction of the time required to load and align a workpiece and therefore does not require the laser to be shut off, thereby eliminating or reducing the settling time before beginning the processing of the next workpiece.

Examining the system diagrams with respect to the timing diagram shows how the present invention increases throughput for a laser processing system. When the apparatus of this preferred embodiment begins processing workpieces, the load arm 82 loads a station 76 with workpiece 78 under control of controller 73 which also directs gantry 86 to move video assembly 90 into position to align workpiece 78 on station 76. This is represented by time period 50 in FIG. 4. At time $T_7$ in FIG. 4 controller 73 directs gantry 86 to move laser beam optical assembly 88 into position to micromachine workpiece 78 on station 76. At this time workpiece 78 is subject to an optional final alignment, by video assembly 90, through the lenses (not depicted) of the laser beam optical assembly 88. Processing is begun. It is contemplated that alignment can also be accomplished by an auxiliary alignment system (not shown). This is represented by time period 52. While workpiece 78 is being processed, at time $t_8$ controller 73 directs load arm 82 to fetch workpiece 78 from autoloader 84 and load it onto station 74, where controller 73 directs gantry 86 to move video assembly 90 into position to align workpiece 78 on station 74, represented by time period 54. At time $t_{10}$ controller 73 directs gantry 86 to move laser beam optics assembly 88 into position and proceeds with final alignment and processing of workpiece 78 on station 74, represented by time period 56. Following the loading of workpiece 78 on station 74, the controller 73 optionally directs the gantry 86 to move the video assembly 90 into position and to begin the inspection of previously processed workpiece 80 on station 76, represented by time period 58. Following the optional inspection 58 or instead of it in the case it is not performed, controller 73 directs load arm 82 to unload workpiece 80 from station 76 and provide it to autoloader 84 and to load a new, unmachined workpiece 78 from autoloader 84 onto station 76, where it is aligned by video assembly 90, represented by time period 60. At time $t_{13}$ workpiece 78 is finished, whereupon controller 73 directs gantry 86 to move laser beam optics assembly 88 and video assembly 90 into their respective positions to begin processing aligned workpiece 80 on station 76 (time period 62) and to begin optionally inspecting the machined workpiece 78 (time period 64). This process can continue as long as a supply of unprocessed workpieces can be provided to the apparatus. Once the apparatus has loaded and aligned first workpiece 78, finished workpieces will be emitted from the apparatus at an average latency substantially equal to the average time required to process a single workpiece. Since the only apparatus components required to be duplicated are an X, Y table and a station, both of which are inexpensive relative to laser beam and video assemblies, increasing system throughput is accomplished while minimizing additional apparatus cost.

Figure 7:
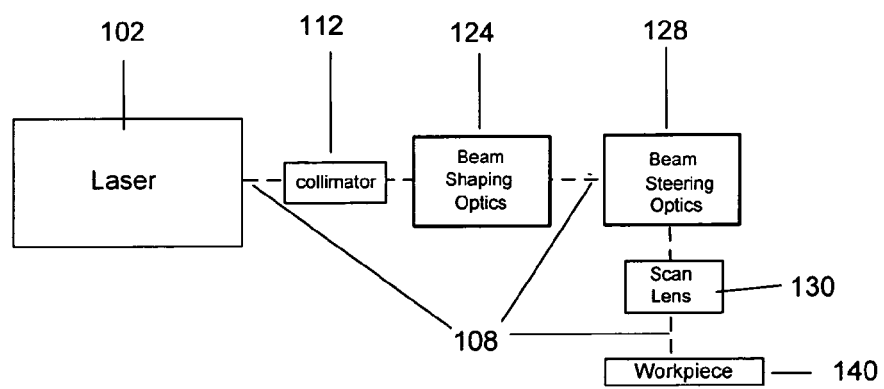
FIG. 7 is a schematic diagram of a laser being used to micromachine a workpiece.

FIG. 7 is a simplified schematic diagram of a preferred embodiment of the present invention comprising one laser 102 generating laser pulses (not shown) which travel along laser beam path 112. The laser beam path passes through a collimator 112, followed by beam shaping optics 124. The beam shaping optics transform the spatial profile of the laser pulses from an essentially Gaussian profile to a more desired profile. The laser beam path 112 then passes through beam steering optics 128, then through scan lens 130 and finally to the workpiece 140. The beam steering optics 128, upon instruction by a controller (not shown), direct the laser beam to desired locations on the workpiece 140.

The invention described herein also includes further improvements in throughput if the requirement to minimize additional cost is relaxed. This would be consistent with a goal of maximizing system throughput while being less concerned with apparatus cost. An additional preferred embodiment employs two or more laser beams working on the same workpiece. In this way, referring to FIG. 4, the time spent processing workpieces (52, 56, and 62) could be reduced and system throughput further increased. Multiple laser beams can be created by splitting the output of a single laser, or combined multiple lasers, into multiple beams. These beams can be controlled jointly, so as to process multiple instances of identical elements combined into a single workpiece, or controlled independently to process any desired pattern. The laser beams may be directed through common optics or have some or all of the optical components that shape and/or steer the beam be separate.

Figure 8:
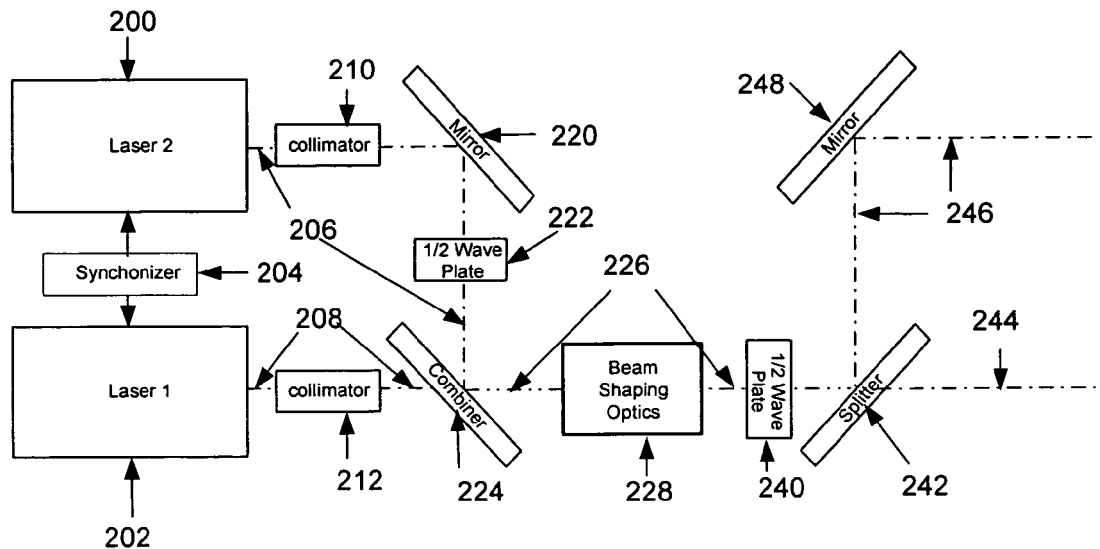
FIG. 8 is a schematic diagram of two lasers being used to create two laser beams.

FIG. 8 is a simplified schematic diagram of this second preferred embodiment of the present invention comprising two processing lasers 200 and 202 driven by a synchronizer source 204. Source 204 could synchronize lasers 200 and 202 by any one of a number of methods including synchronizing the trigger signals sent to illumination sources that pump energy into the lasers or possibly synchronizing Q-switches positioned inside the lasers 200 and 202 to enable them to pulse in an alternating fashion. The lasers 200 and 202 provide at their outputs respective laser beams 206 and 208, each comprised of a laser pulse train. The lasers 200 and 202 are arranged so that the intrinsic linear polarization planes of their respective output laser beams 206 and 208 are substantially parallel. Laser beams 206 and 208 pass through respective collimators 210 and 212, each reducing the diameter of its incident laser beam while maintaining its focus at infinity. Laser beam 206 is turned by mirror 220 to pass through one-half wave plate 222 which rotates polarization state or plane of laser beam 206 90°, so that combiner 224, which responds differentially to the polarization state or plane of incident light, passes laser beam 208 through substantially unaffected and reflects laser beam 206 so that the two beams become a single co-axial laser beam 226 and pass through the beam shaping optics 228 which forms the laser beam into the particular distribution pattern (Gaussian, top hat, etc.) desired. The co-axial laser beam 226 then passes through a second one-half wave plate 240 which is adjusted to turn the polarization axes of the co-axial laser beam 226 to be at an angle of 45° to the polarization axes of the splitter 242. This permits about one-half of the co-axial laser beam 226 to be transmitted by the splitter 242 to form the first laser processing beam 244, and reflect about one-half of the co-axial laser beam 226 to form the second laser processing beam 246, which is turned by mirror 248 to be directed in substantially the same direction as laser beam 244. Note that beams 244 and 248 have identical spatial information. Not shown are the beam steering optics that direct the laser beams to the workpiece.

Processing lasers 200 and 202 may comprise a UV laser, an IR laser, a green laser, or a $CO_2$ laser. They can be the same wavelength or different wavelengths. A preferred processing laser output has a pulse energy that is between about 0.01 μJ and about 1.0 J. A preferred UV processing laser is a Q-switched UV DPSS laser including a solid-state lasant such as Nd:YAG, Nd:YLF, Nd:YAP, or Nd:YVO$_4$, or a YAG crystal doped with ytterbium, holmium, or erbium. The UV laser preferably provides harmonically generated UV laser output at a wavelength such as 354.7 nm (frequency tripled Nd:YAG or Nd:YVO$_4$), 266 nm (frequency quadrupled Nd:YAG or Nd:YVO$_4$), or 213 nm (frequency quintupled Nd:YAG or Nd:YVO$_4$).

A preferred $CO_2$ processing laser is a pulsed $CO_2$ laser operating at a wavelength of between about 9 μm and about 11 μm. An exemplary commercially available pulsed $CO_2$ laser is the Model Q3000 Q-switched laser (9.3 μm) manufactured by Coherent-DEOS of Bloomfield, Conn. Because $CO_2$ lasers are unable to effectively drill vias through metal layers 12 and 14, multilayer workpieces 10 drilled with $CO_2$ processing lasers either lack metal layers 12 and 14 or are prepared such that a target location has been pre-drilled with a UV laser or pre-etched using another process such as, for example, chemical etching, to expose dielectric layers 16.

Figure 9:
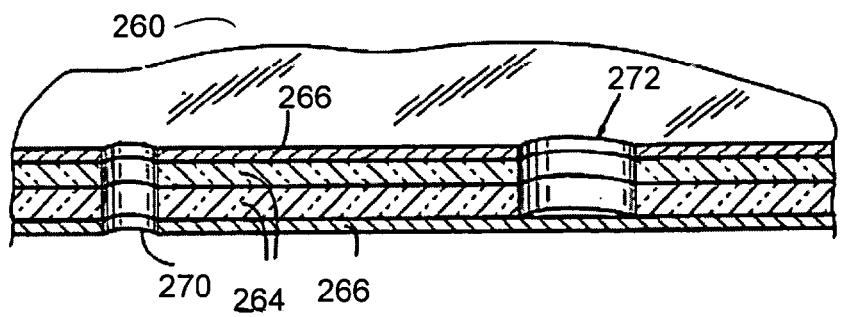
FIG. 9 is a schematic diagram of a multilayer substrate after processing with a laser.

Other solid-state lasants or $CO_2$ lasers operating at different wavelengths may be used in the laser apparatus of the present invention. Various types of laser cavity arrangements, harmonic generation of the solid state laser, Q-switch operation for the solid-state laser and the $CO_2$ laser, pumping schemes, and pulse generation methods for the $CO_2$ laser are also contemplated. FIG. 9 shows a simplified schematic diagram of vias processed in a multilayer workpiece 260 by a laser (not shown). The workpiece comprises organic interlayers 264 sandwiched between layers of metallic conductor material 266. A through-hole via is shown at 270 and a blind via which begins at the top surface of the workpiece and ends when it reaches a metallic conductor 266 is shown at 272.

In cases where, due to improvements in laser processing as disclosed above, time required to micromachine the workpiece becomes less than the time required to inspect and align the workpieces, additional stations may be added so that multiple stations can be employed to align and inspect workpieces for a single laser processing station. In another preferred embodiment, multiple stations are employed to align and inspect workpieces for multiple stations where processing is taking place, where the number of stations and the number of laser beams is balanced to provide maximum throughput for a given amount of processing capacity.

Having multiple stations also allows for a laser processing apparatus to have multifunction capabilities. Multifunction capability is the ability to perform more than one process step on a workpiece on a single apparatus. Some of the advantages of multifunction capability are lower system cost, smaller apparatus footprint in the manufacturing area and higher throughput. An example of a desirable multifunction capability is the ability to inspect the results of laser processing operations on the apparatus that performed the processing.

Inspection refers to using some type of sensing to acquire data from the processed workpiece to determine information regarding the processing operation performed. An example of this would be using a machine vision subsystem to visually inspect the workpiece. For a preferred embodiment of the present invention some of the features that could be inspected for processed vias in multilayer substrates are the location, size, shape, depth, taper, top diameter, bottom diameter and debris. For substrate singulation some of the features to be inspected include the size, shape, depth, taper, direction and debris associated with a kerf. For link blowing, the location and completeness of the link removal, damage to the substrate and debris could be inspected. The data resulting from the inspection can be used to determine whether the features processed meet pre-selected quality standards or be used as input to a statistical process control program. Having multiple stations also facilitates the inspection of the workpiece immediately after processing while the workpiece is still aligned, thereby eliminating the need for the workpiece to be loaded and aligned on a separate system. In addition, inspecting the workpiece on the processing apparatus following processing allows process control information to be fed back to the system immediately, thereby improving process control.

Information generated by inspection includes updating previously measured and calculated alignment information. This is useful in cases where workpiece alignment changes during processing. These changes could be due to normal manufacturing tolerances in the apparatus or changes in environmental factors including temperature or humidity. Inspection would detect these changes and feed the information back to the apparatus to allow the apparatus to alter the calibration information to account for these changes and thereby increase the accuracy of the process. This correction information can be obtained by measuring known fiducial marks on the workpiece or measuring the location of features micromachined on a workpiece as part of the processing. In this case inspection is used to compensate for errors induced in processing workpieces by normal variation in the apparatus or environment.

Figure 10:
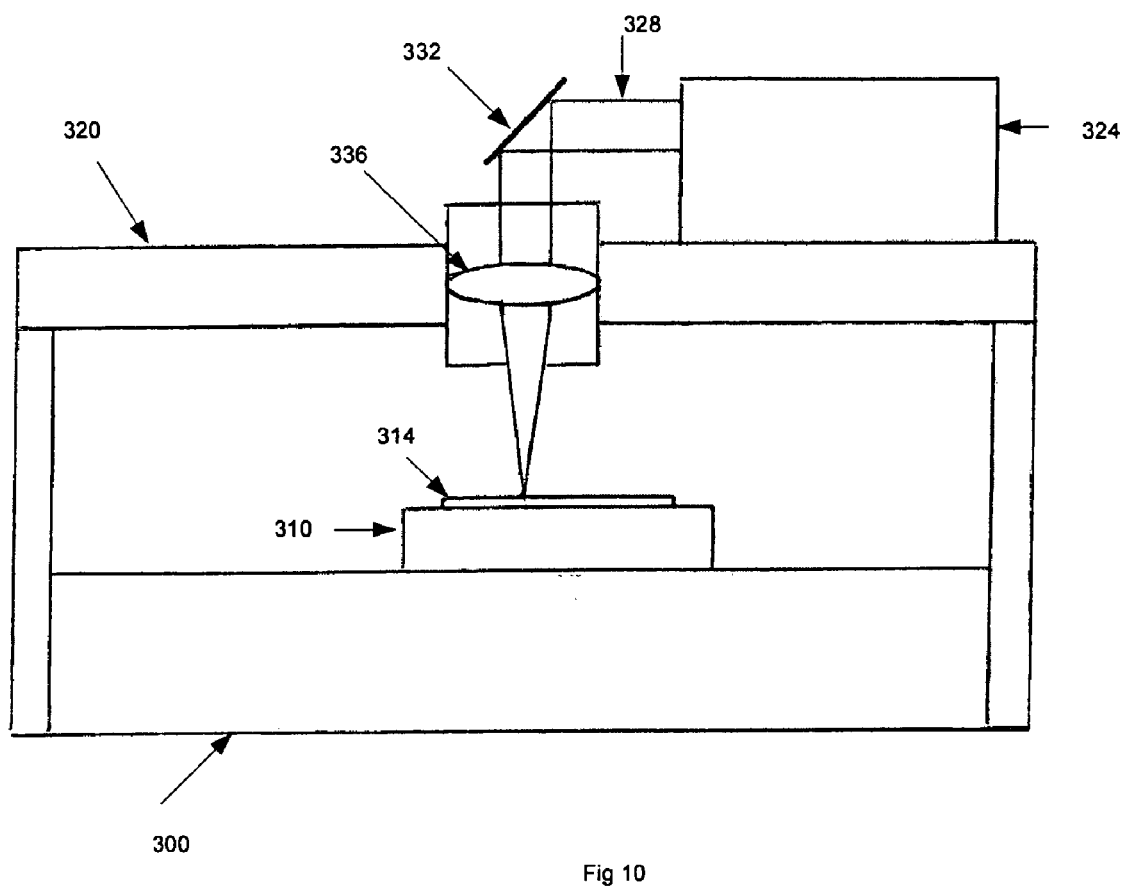
FIG. 10 is a schematic diagram of a laser system being used to singulated or scribe substrates.

In other preferred embodiments, the processing efficiencies generated by the invention disclosed herein are used to improve the singulation or dicing of a wafer or substrate into multiple independent parts. It is common in electronics manufacturing to construct multiple copies of a given circuit or circuit element on a single substrate. Preferred workpieces for semiconductor dicing include silicon wafers, other silicon-based materials including silicon carbide and silicon nitride, and compounds in the III-V and II-VI groups, such as gallium arsenide upon which integrated circuits are constructed using photolithography techniques. A second example is thick film circuitry, in which circuit elements or electronic devices are screen printed on a substrate typically made of a sintered ceramic material. A third example is thin film circuitry, in which conductors and passive circuit elements are applied to a substrate made of, for instance, a semiconductor material, ceramic or other materials, by sputtering or evaporation. A fourth example would be display technology, in which the plastic films and glass substrates used to manufacture displays can be singulated using this technology. These substrates may be singulated, wherein the circuit components built upon the substrate are fully separated into discrete units by the laser or scribed, wherein the laser forms a kerf or groove in the surface of the substrate to direct subsequent mechanical separation of the substrate into discrete units. FIG. 10 shows a simplified schematic diagram of a preferred embodiment directed towards singulation or scribing. A platform 300 holds a stage 310 upon which is mounted a workpiece 314. A gantry 320 holds a laser 324, which emits laser pulses (not shown) along a laser beam path 328. The laser beam path 328 is directed by beam steering optics 332 through a scan lens 336 which focuses the laser beam path 328 onto the workpiece 314. In addition to the relative motion between the laser beam path 328 and the workpiece 314 imparted by the beam steering optics 332, the stage 310 may contain motion control elements that move the workpiece 314 with respect to the laser beam path 328. The workpiece 314 may be a silicon wafer or other substrate. Using the invention described herein will increase the throughput of these processes, since the rate of singulation or scribing, like via drilling, is a function of the number of pulses at energies greater than the ablation threshold delivered for each unit time, plus the time required to load and align workpieces.

It is contemplated that for different single or multilayer workpieces composed of different materials, varying laser parameters, such as pulse repetition rate, energy per pulse, and beam spot size, can be programmed during different processing stages to effect optimal laser processing throughput and quality. See, e.g., U.S. Pat. No. 5,841,099 of Owen et al. and U.S. Pat. No. 6,407,363 of Dunsky et al., both of which are assigned to the assignee of the present patent application. The operational parameters of the heating source, such as its power, energy distribution profile, and spot size, can be kept constant or changed during various stages of laser processing.

It will be apparent to those of ordinary skill in the art that many changes may be made to the details of the above-described embodiments of this invention without departing from the underlying principles thereof. The scope of the present invention should, therefore, be determined only by the following claims.

The invention claimed is:

1. A method for processing first and second workpieces with a laser processing system, said laser processing system including a controller, a laser emitting a laser beam that propagates along a laser beam path and having laser optics, first and second motion stages for holding said first and second workpieces, a video assembly, and a gantry, said controller being operatively connected to said laser, laser optics, video assembly, gantry, and first and second motion stages, comprising:
   loading said first workpiece upon said first motion stage;
   aligning using said video assembly in cooperation with said controller to align said first workpiece in relation to said laser beam path;
   processing said first workpiece with said laser beam;
   loading said second workpiece upon said second motion stage; and
   while said first workpiece is aligned in relation to said laser beam path, using said video assembly in cooperation with said controller to align said second workpiece in relation to said laser beam path;
   wherein said operative connection of said controller with said laser, laser optics, video assembly, and first and second motion stages permits said controller, in cooperation with said gantry, to acquire and maintain said alignment between said second workpiece and said laser beam path during said processing of said first workpiece.

2. The method of claim 1 wherein said video assembly constitutes a first video assembly and said laser processing system further includes a second video assembly that is operatively connected to said controller, and wherein the step of aligning said second workpiece in relation to said laser beam path further comprises aligning said second workpiece in relation to said laser beam path with said second video assembly in cooperation with said controller to permit said controller to acquire and maintain, in cooperation with said gantry, said alignment between said second workpiece and said laser beam path during said processing of said first workpiece.

3. The method of claim 1 further comprising providing a datum in relation to said laser beam path, and wherein said aligning of said second workpiece includes indexing said second workpiece or laser beam in relation to said datum.

4. The method of claim 1 wherein said step of processing comprises forming a via or vias.

5. The method of claim 1 wherein said step of processing comprises removing semiconductor links.

6. The method of claim 1 wherein said step of processing comprises trimming a passive electronic component.

7. The method of claim 1 wherein said step of processing comprises scribing or singulating a substrate.

8. A method for processing first and second workpieces with a laser processing system, said laser processing system including a controller, a laser emitting a laser beam that propagates along a laser beam path and having laser optics, first and second motion stages for holding said first and second workpieces, a video assembly, and a gantry, said controller being operatively connected to said gantry, laser, laser optics, camera, camera optics, and first and second motion stages, comprising:
   loading a first workpiece upon said first motion stage;
   using said video assembly in cooperation with said controller to align said first workpiece in relation to said laser beam path;
   processing said first workpiece with said laser beam;
   loading a second workpiece upon motion stage second stage;
   while said first workpiece is aligned in relation to said laser beam path, aligning said second workpiece in relation to said laser beam path with said video assembly in cooperation with said controller;
   wherein said operative connection of said controller with said laser, laser optics, video assembly, and first and second motion stages permits said controller, in cooperation with said gantry, to acquire and maintain said alignment between said second workpiece and said laser beam path during said processing of said first workpiece; and
   performing an additional processing step on said first workpiece while said second workpiece is aligned to said laser beam path.

9. The method of claim 8 wherein the additional processing step comprises inspecting said first workpiece.

10. A laser processing apparatus for processing first and second workpieces comprising:
   a gantry;
   a laser having a laser beam path and laser optics;
   a video assembly; and
   a first stage and a second stage for holding said first and second workpieces;
   wherein said gantry, laser, laser optics, video assembly, and first and second stages are operatively connected to said controller to permit said controller to acquire and maintain, in cooperation with said gantry, said alignment between said second workpiece and said laser beam path during said processing of said first workpiece.

11. The apparatus of claim 10 in which said apparatus is configured for forming a via or vias.

12. The apparatus of claim 10 in which said apparatus is configured for removing semiconductor links.

13. The apparatus of claim 10 in which said apparatus is configured for trimming a passive electronic component.

14. The apparatus of claim 10 in which said apparatus is configured for scribing or singulating a substrate.

* * * * *